United States Patent
Spencer et al.

(10) Patent No.: US 12,513,922 B2
(45) Date of Patent: Dec. 30, 2025

(54) β-$Ga_2O_3$ JUNCTION BARRIER SCHOTTKY (JBS) DIODES WITH SPUTTERED p-TYPE NiO

(71) Applicant: The Government of the United States of America, as represented by the Secretary of the Navy, Arlington, VA (US)

(72) Inventors: Joseph A. Spencer, Springfield, VA (US); Marko J. Tadjer, Vienna, VA (US); Alan G. Jacobs, Rockville, MD (US); Karl D. Hobart, Alexandria, VA (US); Yuhao Zhang, Blacksburg, VA (US)

(73) Assignee: The Government of the United States of America, as represented by the Secretary of the Navy, Arlington, VA (US)

( * ) Notice: Subject to any disclaimer, the term of this patent is extended or adjusted under 35 U.S.C. 154(b) by 452 days.

(21) Appl. No.: 18/340,134

(22) Filed: Jun. 23, 2023

(65) Prior Publication Data

US 2023/0420539 A1     Dec. 28, 2023

Related U.S. Application Data

(60) Provisional application No. 63/355,123, filed on Jun. 24, 2022.

(51) Int. Cl.
*H10D 8/60*     (2025.01)
*H10D 8/01*     (2025.01)

(52) U.S. Cl.
CPC .............. *H10D 8/051* (2025.01); *H10D 8/605* (2025.01)

(58) Field of Classification Search
CPC ...... H10D 8/051; H10D 62/106; H10D 62/60; H10D 62/82; H10D 62/8325; H10D 64/64;

(Continued)

(56) References Cited

U.S. PATENT DOCUMENTS

2018/0174938 A1*   6/2018   Uchida ................ H10D 62/105

OTHER PUBLICATIONS

H. H. Gong et al., "A 1.86-kV double-layered NiO/β-Ga2O3 vertical p-n heterojunction diode." Applied Physics Letters 117.2 (2020): 022.

(Continued)

*Primary Examiner* — Moin M Rahman
(74) *Attorney, Agent, or Firm* — US Naval Research Laboratory; Joslyn J. Barritt

(57) ABSTRACT

A self-aligned lithography process for the fabrication of an electronic device having predefined areas of a second semiconductor material having a second conductivity type deposited into trenches formed in a first semiconductor material layer having a first conductivity type. A single lithography mask is used for etching trenches in the first semiconductor material, enabling cleaning of the trenches, and providing defined areas for the deposition of the second semiconductor material into the first semiconductor material. The presence of the areas of the second semiconductor material within the first semiconductor material creates a heterojunction beneath a metal for the formation of a first type of contact to the first semiconductor material and a second type of contact to the second type of material. By using a single mask for the etching, cleaning, and filling steps, misalignment issues plaguing devices having small (1-2 μm) feature sizes is eliminated.

10 Claims, 10 Drawing Sheets

(58) Field of Classification Search
CPC ........... H10D 62/126; H10D 8/00–825; H10D 99/00; H10D 62/80; H10D 62/8271; H10D 62/105
See application file for complete search history.

(56) References Cited

OTHER PUBLICATIONS

Qinglong Yan et al., "β Ga2O3 hetero junction barrier Schottky diode with reverse leakage current modulation and BV2/Ron, sp value of 0.93 GW/cm2." Applied Physics Letters 118.12 (2021): 1221.

Jian Sian Li et al., "Demonstration of 4.7 kV breakdown voltage in NiO/β Ga2O3 vertical rectifiers." Applied Physics Letters 121.4 (2022): 0421.

Feihong Wu et al., "Superior Performance β Ga2O3 Junction Barrier Schottky Diodes Implementing p NiO Heterojunction and Beveled Field Plate for Hybrid Cockcroft-Walton Voltage Multiplier." IEEE Transactions on Electron Devices (2023).

K.R. Williams, et al., "Etch Rates for Micromachining Processing—Part II," J. Microelectromechanical Systems, vol. 12, No. 6, pp. 761, 2003.

\* cited by examiner

β-Ga₂O₃ JUNCTION BARRIER SCHOTTKY (JBS) DIODES WITH SPUTTERED p-TYPE NiO

CROSS-REFERENCE

This application is a Nonprovisional of and claims the benefit of priority under 35 U.S.C. § 119 based on U.S. Provisional Patent Application No. 63/355,123 filed on Jun. 24, 2022. The Provisional application and all references cited herein are hereby incorporated by reference into the present disclosure in their entirety.

FEDERALLY-SPONSORED RESEARCH AND DEVELOPMENT

The United States Government has ownership rights in this invention. Licensing inquiries may be directed to Office of Technology Transfer, US Naval Research Laboratory, Code 1004, Washington, DC 20375, USA; +1.202.767.7230; techtran@nrl.navy.mil, referencing Navy Case #211112.

TECHNICAL FIELD

The present disclosure relates to fabrication of a gallium oxide junction barrier Schottky diode.

BACKGROUND

Over the last two decades, ultra-wide bandgap gallium oxide has become one of the most widely researched semiconductors in the fields of electrical and material science engineering. Such interest stems from the ultra-wide bandgap (4.8 eV) of gallium oxide and the prospect of a critical electric field breakdown strength (6-8 MV/cm) that exceeds wide bandgap SiC and GaN technology. A profusion of other material and electrical properties have also contributed to its rise in interest. Advances in melt-growth technology have already produced 2" and 4" wafers of gallium oxide. Unlike GaN, homoepitaxial growth of gallium oxide onto native gallium oxide substrates is readily possible, thus reducing the need for a buffer layer and improving lattice mismatch. Epitaxial growth methods such as Metal Organic Chemical Vapor Deposition (MOCVD) and Hydride Vapor Phase Epitaxy (HVPE) are capable of growing high quality, single crystalline gallium oxide epitaxial layers with a low background acceptor concentration. The ability to dope and implant gallium oxide with donors such as silicon, germanium, and tin has also been shown across a wide range of concentrations ($10^{15}$-$10^{21}$ cm$^{-3}$). This allows for lowly doped drift layers as well as areas of highly doped selective ion implantation. From a device point-of-view, demonstrations of lateral high electro mobility transistors (HEMTs) and vertical (Fin-Field Effect Transistors or Fin-FETs, Current Aperture Electron Transistors or CAVETs, and Schottky Barrier Diodes or SBDs) devices have offered much promise for the future of gallium oxide devices. While there are many advantageous material and electrical properties of gallium oxide, there are two important issues plaguing the material; a low thermal conductivity and a lack of p-type doping.

It is the lack of p-type doping within gallium oxide that this invention serves to circumvent. Unlike SiC and GaN which can be doped with Al and Mg, respectively to form p-type material, the prospect of p-type gallium oxide has yet to be realized during growth or by ion implantation. This issue arises from the flat valance band of the Brillouin zone which leads to the self-trapping of holes with a very large effective mass. The formation of a junction barrier Schottky diode relies on a p-n junction beneath the device anode. It is here that nickel oxide, a wide bandgap (3.7 eV) p-type semiconductor serves as the substitute for p-type gallium oxide. The heterojunction formed between nickel oxide and gallium oxide has a favorable band offset and is stable at room temperature. Nickel oxide is most commonly deposited via RF reactive sputtering from a nickel or nickel oxide target.

Over the last few years many works have utilized nickel oxide (NiO) for the electric field termination region of gallium oxide (Ga₂O₃) devices as well as the p-type material in a (Ga₂O₃) p-n heterojunction diode. See H. H. Gong et al., "A 1.86-kV double-layered NiO/β-Ga2O3 vertical p-n heterojunction diode." Applied Physics Letters 117.2 (2020): 022; Qinglong Yan et al., "β-Ga2O3 hetero-junction barrier Schottky diode with reverse leakage current modulation and BV2/Ron, sp value of 0.93 GW/cm2." Applied Physics Letters 118.12 (2021): 1221; and Jian-Sian Li et al., "Demonstration of 4.7 kV breakdown voltage in NiO/β-Ga2O3 vertical rectifiers." Applied Physics Letters 121.4 (2022): 0421.

Few works have recently shown heterojunction Schottky barrier diodes with NiO deposited atop the Ga₂O₃. The deposition and liftoff of NiO into etched regions of Ga₂O₃ has been demonstrated even fewer times, with the detailed methods being unable to withstand chemical treatment or elevated temperatures. The most commonly used method for the etching of Ga₂O₃ is a high power boron trichloride plasma etch that has been shown to leave behind rough sidewalls and chlorine residue.

One recent publication describes a self-aligned process involving the thermal oxidation of Ni metal into nickel oxide. See Feihong Wu et al., "Superior Performance β-Ga₂O₃ Junction Barrier Schottky Diodes Implementing p-NiO Heterojunction and Beveled Field Plate for Hybrid Cockcroft-Walton Voltage Multiplier." IEEE Transactions on Electron Devices (2023). The process developed by Wu et al. involves etching the gallium oxide and using the same mask to deposit a thin film of Ni into the etch region. An oxygen anneal is carried out to form nickel oxide. This process is repeated 14 more times in order to fill the etched region before lifting off the mask. However, by subjecting the Ga₂O₃ to numerous high temperature oxygen anneals, the material quality is likely being impacted significantly as it is very difficult to analyze the vacancies and defects that arise from oxygen annealing.

A junction barrier Schottky diode can also be fabricated using a SiO2/Ni mask. The mask can be removed using buffered oxide etchant. However, this method is only compatible with tetramethylammonium hydroxide as the chemical for etching damage removal and thus is not generally useful.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides a self-aligned lithography process for the etching, cleaning, and filling of trenches in a heterostructure so that a first type of semiconductor material can be deposited into a second type of semiconductor material in a predefined pattern, where the location, width, and separation of the areas of the second type of material are defined by patterning photoresist.

In some embodiments, areas of a p-type semiconductor material such as but not limited to Silicon, Gallium Arsenide, Gallium Nitride, Aluminum Gallium Nitride, Aluminum Nitride, Boron Nitride, binary ($Cu_2O$) and ternary Copper oxides, spinel oxides (e.g., $ZnIr_2O_4$), perovskites (e.g., Lanthanide-based perovskites $LaRhO_3$, $LaCrO_3$, etc.), Nickel Oxide, Cuprous Iodide (CuI), or Diamond can be deposited in one or more predefined trenches etched into a bulk or epitaxial n-type semiconductor such as, but not limited to, Gallium Oxide, Germanium Oxide, Aluminum Oxide, Zinc Oxide, Indium Oxide, Tin Oxide, Cadmium Oxide, Scandium Oxide, Aluminum Nitride, Boron Nitride, Diamond, or ternary and quaternary compounds of the aforementioned oxides such as Aluminum Gallium Oxide (AGO), Lithium Gallium Oxide (LGO), Aluminum Zinc Oxide (AZO), Gallium Zinc Oxide (GZO), Indium Zinc Oxide (IZO), Indium Tin Oxide (ITO), Indium Tin Zirconium Oxide (ITZO), Indium Gallium Oxide (IGO), Indium Gallium Zinc Oxide (IGZO), Zinc Tin Oxide (ZTO), and perovskite oxides such as titanates (e.g, $BaTiO_3$), niobates (e.g., $LiNbO_3$), stannates ($ASnO_3$, where A=Ba, Sr. or Ca), or vanadium oxides ($AVO_3$, A=Ca, Sr, Ba, Sr), etc., to form a patterned heterojunction barrier for the operation of two-terminal devices such as a Junction Barrier Schottky (JBS) rectifier or three-terminal devices such as lateral or vertical junction field effect transistors (JFET), a heterojunction bipolar transistor (HBT), or a hot electron transistor.

In other embodiments, areas of an n-type semiconductor such as but not limited to, Gallium Oxide, Germanium Oxide, Aluminum Oxide, Zinc Oxide, Indium Oxide, Tin Oxide, Cadmium Oxide, Scandium Oxide, Aluminum Nitride, Boron Nitride, Diamond, or ternary and quaternary compounds of the aforementioned oxides such as Aluminum Gallium Oxide (AGO), Lithium Gallium Oxide (LGO), Aluminum Zinc Oxide (AZO), Gallium Zinc Oxide (GZO), Indium Zinc Oxide (IZO), Indium Tin Oxide (ITO), Indium Tin Zirconium Oxide (ITZO), Indium Gallium Oxide (IGO), Indium Gallium Zinc Oxide (IGZO), Zinc Tin Oxide (ZTO), and perovskite oxides such as titanates (e.g, $BaTiO_3$), niobates (e.g., $LiNbO_3$), stannates ($ASnO_3$, where A=Ba, Sr. or Ca), vanadium oxides ($AVO_3$, A=Ca, Sr, Ba, Sr), etc., can be deposited in one or more predefined trenches etched into a bulk or epitaxial p-type semiconductor material such as, but not limited to, Silicon, Gallium Arsenide, Gallium Nitride, Aluminum Gallium Nitride, Aluminum Nitride, Boron Nitride, binary ($Cu_2O$) and ternary Copper oxides, spinel oxides (e.g., $ZnIr_2O_4$), perovskites (e.g., Lanthanide-based perovskites $LaRhO_3$, $LaCrO_3$, etc.), Nickel Oxide, Cuprous Iodide (CuI), or Diamond to form a patterned heterojunction barrier for the operation of two-terminal devices such as a Junction Barrier Schottky (JBS) rectifier or three-terminal devices such as lateral or vertical junction field effect transistors (JFET), a heterojunction bipolar transistor (HBT), or a hot electron transistor.

In an exemplary embodiment, the present invention provides a self-aligned lithography process for the fabrication of a β-$Ga_2O_3$ Junction Barrier Schottky (JBS) diode in which areas of p-type NiO are deposited into etched regions of n-type $Ga_2O_3$. In accordance with the present invention, a single lithography mask is used for etching trenches in the heterostructure, enabling cleaning of the trenches, and providing defined areas for the deposition of the NiO into the $Ga_2O_3$ bulk. The presence of the p-type NiO areas within the n-type $Ga_2O_3$ creates a heterojunction beneath the anode metal for the formation of both a Schottky contact to the $Ga_2O_3$ and an Ohmic contact to the NiO. By using a single mask for the etching, cleaning, and filling steps, the misalignment issues plaguing devices having small (less than 2 m) feature sizes is eliminated.

DETAILED DESCRIPTION

Figure 1A:
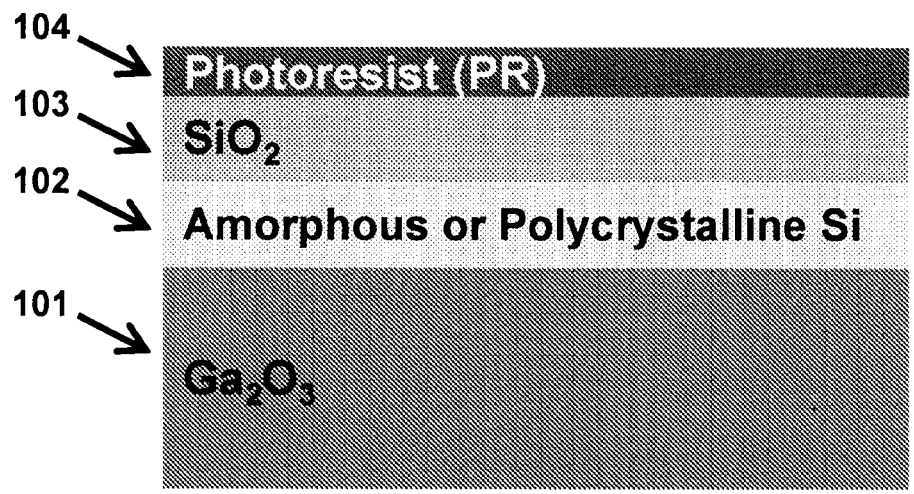
FIGS. 1A-1M are block schematics illustrating an exemplary embodiment of a self-aligned lithography process for the fabrication of a gallium oxide junction barrier Schottky diode in accordance with the present intervention.

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides a self-aligned lithography process for the etching, cleaning, and filling of trenches in a heterostructure so that a first type of semiconductor material can be deposited into a second type of semiconductor material in a predefined pattern, where the location, width, and separation of the areas of the second type of material are defined by patterning. In some embodiments, areas of a p-type semiconductor material such as, but not limited to, Silicon, Gallium Arsenide, Gallium Nitride, Aluminum Gallium Nitride, Aluminum Nitride, Boron Nitride, binary ($Cu_2O$) and ternary Copper oxides, spinel oxides (e.g., $ZnIr_2O_4$), perovskites (e.g., Lanthanide-based perovskites $LaRhO_3$, $LaCrO_3$, etc.), Nickel Oxide, Cuprous Iodide (CuI), or Diamond can be deposited in one or more predefined trenches etched into a bulk or epitaxial n-type semiconductor such as, but not limited to, Gallium Oxide, Germanium Oxide, Aluminum Oxide, Zinc Oxide, Indium Oxide, Tin Oxide, Cadmium Oxide, Scandium Oxide, Aluminum Nitride, Boron Nitride, Diamond, or ternary and quaternary compounds of the aforementioned oxides such as Aluminum Gallium Oxide (AGO), Lithium Gallium Oxide (LGO), Aluminum Zinc Oxide (AZO), Gallium Zinc Oxide (GZO), Indium Zinc Oxide (IZO), Indium Tin Oxide (ITO), Indium Tin Zirconium Oxide (ITZO), Indium Gallium Oxide (IGO), Indium Gallium Zinc Oxide (IGZO), Zinc Tin Oxide (ZTO), perovskite oxides such as titanates (e.g, $BaTiO_3$), niobates (e.g., $LiNbO_3$), stannates ($ASnO_3$, where A=Ba, Sr. or Ca), and vanadium oxides ($AVO_3$, A=Ca, Sr, Ba, Sr), etc., to form a patterned heterojunction barrier for the operation of two-terminal devices such as a Junction Barrier Schottky (JBS) rectifier or three-terminal devices such as lateral or vertical junction field effect transistors (JFET), a heterojunction bipolar transistor (HBT), or a hot electron transistor.

In other embodiments, areas of an n-type semiconductor such as, but not limited to, Gallium Oxide, Germanium Oxide, Aluminum Oxide, Zinc Oxide, Indium Oxide, Tin Oxide, Cadmium Oxide, Scandium Oxide, Aluminum Nitride, Boron Nitride, Diamond, or ternary and quaternary compounds of the aforementioned oxides such as Aluminum Gallium Oxide (AGO), Lithium Gallium Oxide (LGO), Aluminum Zinc Oxide (AZO), Gallium Zinc Oxide (GZO), Indium Zinc Oxide (IZO), Indium Tin Oxide (ITO), Indium Tin Zirconium Oxide (ITZO), Indium Gallium Oxide (IGO), Indium Gallium Zinc Oxide (IGZO), Zinc Tin Oxide (ZTO), perovskite oxides such as titanates (e.g, $BaTiO_3$), niobates (e.g., $LiNbO_3$), stannates ($ASnO_3$, where A=Ba, Sr. or Ca), and vanadium oxides ($AVO_3$, A=Ca, Sr, Ba, Sr), etc., can be deposited in one or more predefined trenches etched into a bulk or epitaxial p-type semiconductor material such as, but not limited to, Silicon, Gallium Arsenide, Gallium Nitride, Aluminum Gallium Nitride, Aluminum Nitride, Boron Nitride, binary ($Cu_2O$) and ternary Copper oxides, spinel oxides (e.g., $ZnIr_2O_4$), perovskites (e.g., Lanthanide-based perovskites $LaRhO_3$, $LaCrO_3$, etc.), Nickel Oxide, Cuprous Iodide (CuI), or Diamond to form a patterned heterojunction barrier for the operation of two-terminal devices such as a Junction Barrier Schottky (JBS) rectifier or three-terminal devices such as lateral or vertical junction field effect transistors (JFET), a heterojunction bipolar transistor (HBT), or a hot electron transistor.

The self-aligned lithography process and process for fabricating a diode in accordance with the present will be described below in the context of a β-$Ga_2O_3$ Junction Barrier Schottky (JBS) diode in which areas of p-type NiO are deposited into n-type $Ga_2O_3$. However, as noted above, other n- and p-type materials can be used to form other kinds of devices, and all such materials and devices are deemed to be within the scope of the present invention.

As noted above, both the physical and chemical damage caused by high-power boron trichloride plasma etching of $Ga_2O_3$ are known to negatively impact device performance by degrading the heterojunction and increasing leakage current. Aggressive acid treatments such as phosphoric acid, piranha (a mixture of sulfuric acid and hydrogen peroxide), and hydrochloric acid, as well as strong bases such as potassium hydroxide and tetramethylammonium hydroxide, have been used to remove the damage left behind by the plasma etch process, but such treatments may present their own problems.

The present invention provides a solution to these problems by offering a fabrication method for the formation of a self-aligned $Ga_2O_3$ junction barrier Schottky diode that is resistant to most commonly used acid treatments and elevated temperatures, as well as being capable of producing critical device feature sizes smaller than 1 µm. As described in more detail below, in accordance with the present invention, a single lithography mask is used for etching trenches in the heterostructure, for cleaning of the trenches, and for providing defined areas for the deposition of the NiO into the $Ga_2O_3$ bulk. The presence of the p-type NiO areas within the n-type $Ga_2O_3$ creates a heterojunction beneath the anode metal for the formation of both a Schottky contact to the $Ga_2O_3$ and an Ohmic contact to the NiO. By using a single mask for the etching, cleaning, and filling steps, the misalignment issues plaguing devices having small (less than 2 m) feature sizes is eliminated.

The block schematics in FIGS. 1A-1M illustrate aspects of an exemplary embodiment of a self-aligned lithography process that can be used for the fabrication of a $Ga_2O_3$ junction barrier Schottky diode in accordance with the present intervention.

As illustrated in FIG. 1A, in a first step, the process begins with the deposition of a layer of amorphous (a-Si) or polycrystalline silicon (poly-Si) 102 (often referred to herein as "a-Si/poly-Si" layer 102), typically having a thickness of about 0.5-1 µm, on an n-type $Ga_2O_3$ substrate 101. The $Ga_2O_3$ substrate typically will be β-$Ga_2O_3$ since that is the form of $Ga_2O_3$ that is most thermodynamically stable at standard temperature and pressure and is commercially available. A thin (typically 100-200 nm) silicon dioxide ($SiO_2$) layer 103 is then deposited on the a-Si/poly-Si layer 102 and a photoresist 104 is deposited on $SiO_2$ layer 103. In an exemplary embodiment, the photoresist is a Shipley photoresist such as a S1811 PR layer known in the art, but any suitable photoresist can be used.

Figure 1B:
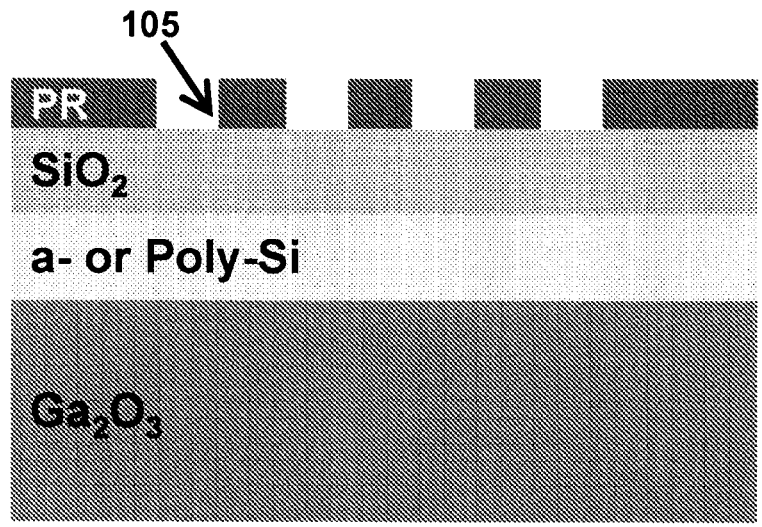

In a second step, illustrated by the block schematic in FIG. 1B, the photoresist layer 104 is patterned in a predetermined manner to provide a predetermined plurality of areas 105 for deposition of the NiO in the diode in a manner described below.

Figure 1C:
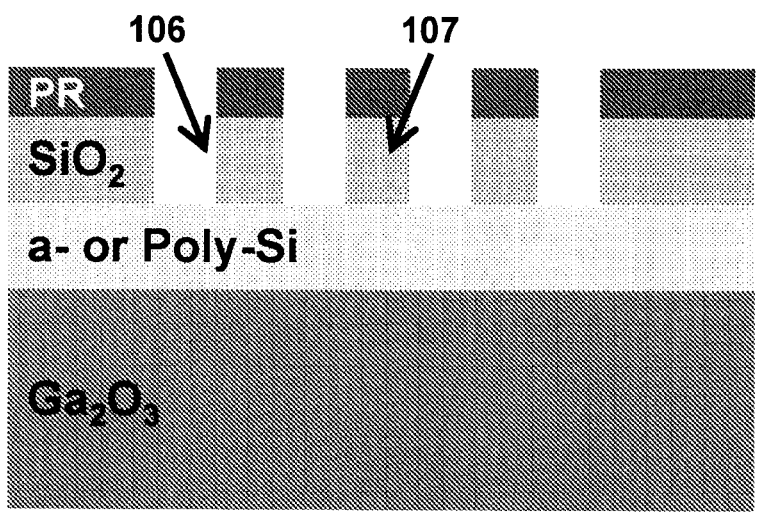

In a third step, illustrated by the block schematic in FIG. 1C, $SiO_2$ layer 103 is etched to form trenches 106 in the $SiO_2$ and mesas 107 formed by the unetched $SiO_2$. The etching can be accomplished using any suitable etching technique, such as a buffered oxide etch (BOE) or a fluorine etch if a dry etch is desired. In an exemplary embodiment, the etched trenches have a width of about 2.2 m, while the distance in the $SiO_2$ between the trenches is about 1.7 µm.

Figure 1D:
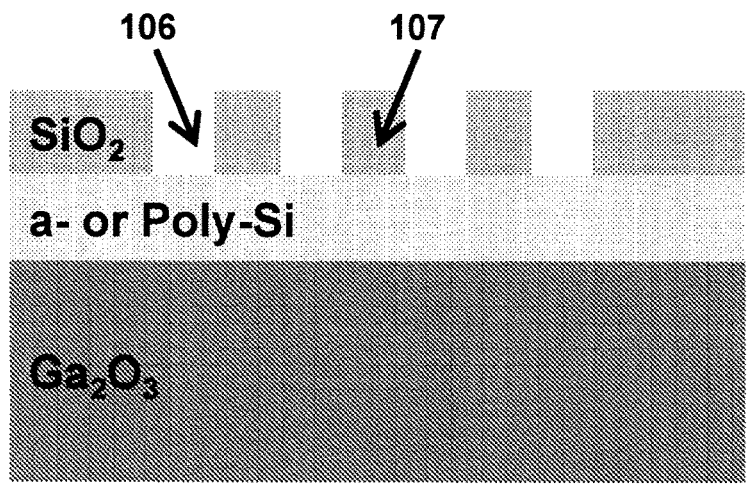
Figure 1E:
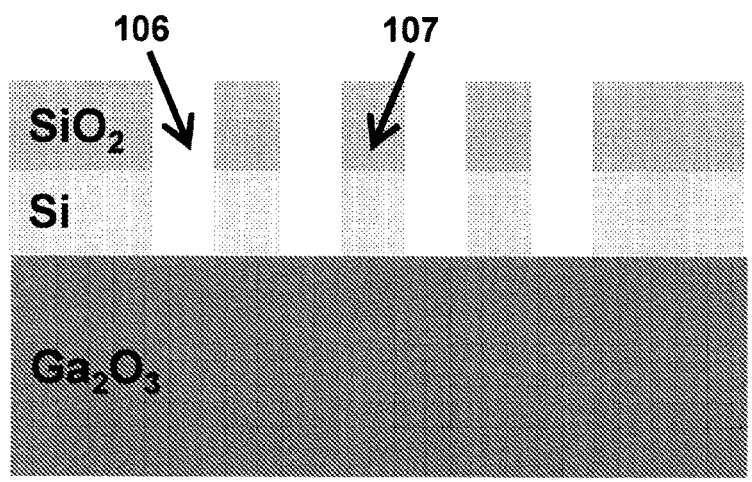

The photoresist layer 104 is then removed, as illustrated in FIG. 1D, and in the next step, illustrated by the block schematic in FIG. 1E, a-Si or poly-Si layer 102 is anisotropically etched, e.g., using $SF_6$, to extend trenches 106 into a-Si/poly-Si layer 102, with mesas 107 comprising both the $SiO_2$ and a-Si/poly-Si materials.

Figure 1F:
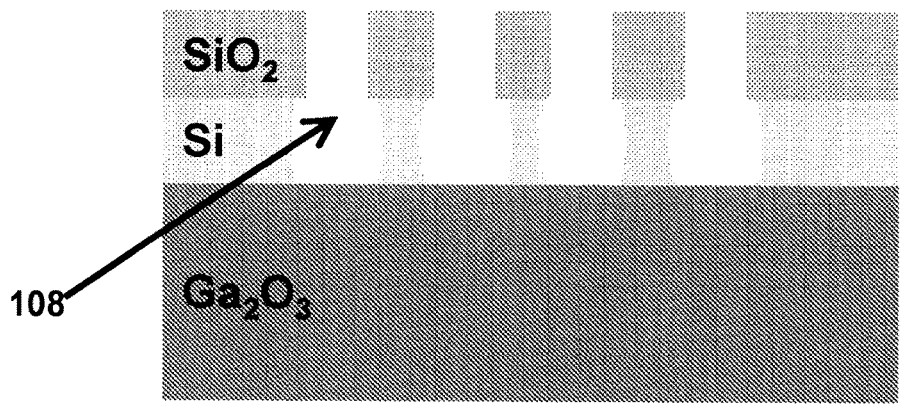

In the next step, illustrated in FIG. 1F, a short, typically 1-5 second, $XeF_2$ etch is performed in trenches 106 within the a-Si/poly-Si material layer to form undercut areas 108 in the a-Si/poly-Si material, where the undercut areas undercut the $SiO_2$ material in $SiO_2$ layer 103. As described below, this undercut of a-Si/poly-Si 102 layer allows for the removal of a-Si/poly-Si 102 and $SiO_2$ layer 103 after deposition of the NiO.

Figure 1G:
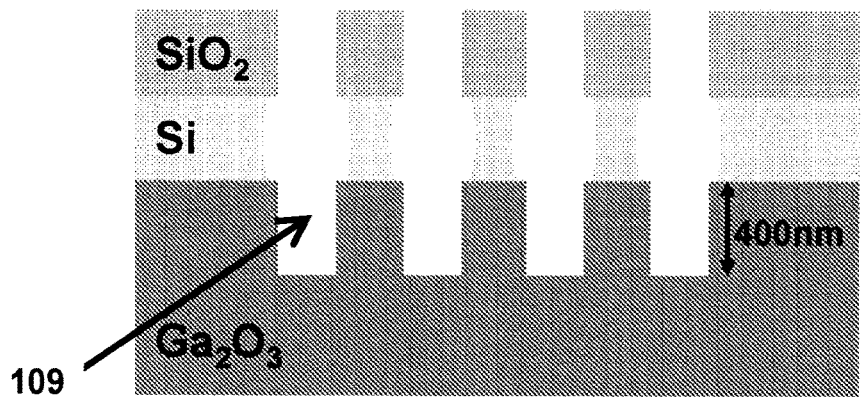

In the next step, illustrated in FIG. 1G, trenches 106 with undercut areas 108 are further etched to provide deep trenches 109 within the n-type $Ga_2O_3$ layer 101. Etching of $Ga_2O_3$ can be accomplished by any suitable etching method known in the art. In an exemplary embodiment, $Ga_2O_3$ layer 101 is thus etched by means of 10-minute 800 W boron trichloride ($BCl_3$) etch to provide trenches having a depth of approximately 400 nm in the $Ga_2O_3$.

Figure 1H:
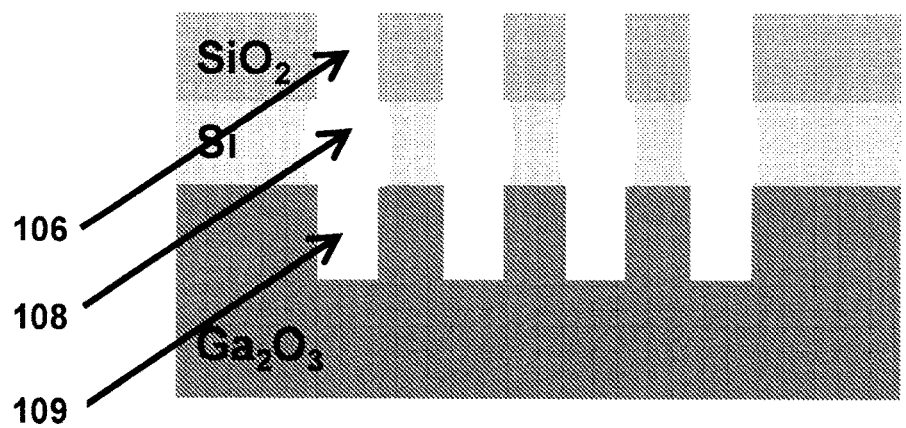

Next, as illustrated in FIG. 1H, the sidewalls of the trenches 106, undercut areas 108, and deep trenches 109 are cleaned, e.g., using a hot phosphoric wet etch at 80° C. for 10 minutes to remove the physical and chemical damage induced by the aggressive, high power 800 W $BCl_3$ plasma etch. More details regarding this cleaning step are provided later with respect to FIG. 4A and FIG. 4B.

Figure 1I:
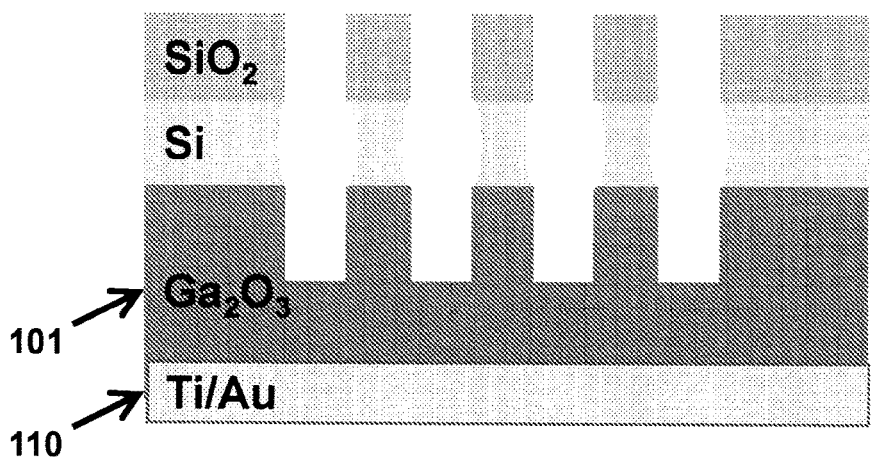

In a next step, as shown in FIG. 1I, a Ti/Au Ohmic contact layer 110 is then formed on a backside of the $Ga_2O_3$ layer 101, and the structure is subjected to an appropriate annealing to form an improved Ohmic contact between the Ti/Au layer 110 and the $Ga_2O_3$ layer 101. In an embodiment where the Si layer is polycrystalline Si, annealing can be done at, e.g., 470° C. for 60 seconds under a nitrogen flow rate of 850 sccm, but annealing under other conditions can be used as appropriate.

Figure 1J:
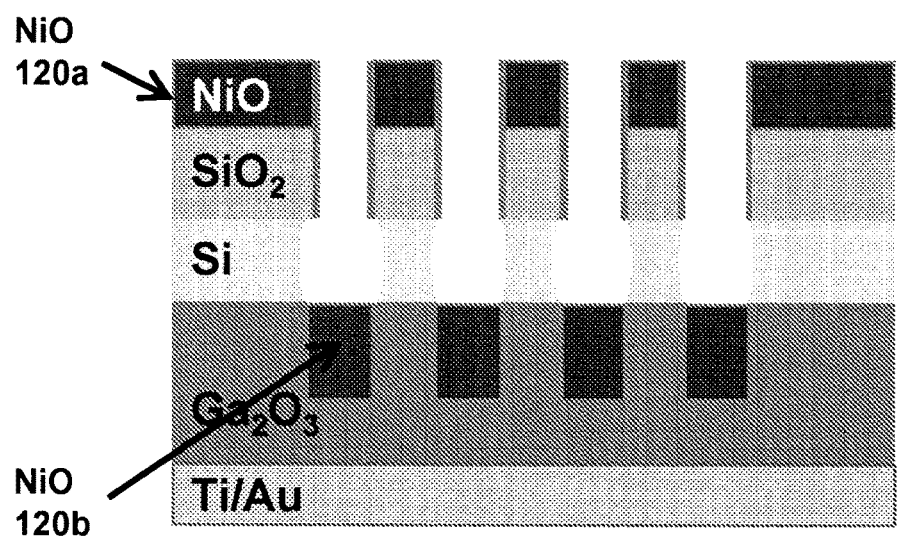

In a next step, illustrated by the block schematic in FIG. 1J, a layer 120a of p-type NiO is deposited on the upper surface of the $SiO_2$ layer 102. In addition, NiO is also deposited in the trenches 109 formed in $Ga_2O_3$ layer 101, with the thickness of the NiO, both on the $SiO_2$ layer and in the trenches 109, being sufficient to fill the trenches and form areas of p-type NiO 120b within the n-type $GaO_2$ layer 101. For example, in the case described above where the trenches have a depth of 400 nm, the NiO layer deposited both on the $SiO_2$ layer and in the trenches will have a thickness of less than, equal to, or greater than 400 nm and is only restricted by the thickness of the a-Si layer. Those skilled in the art will recognize that the NiO thickness and doping density will control the charge balance in the rectifier. Deposition of the NiO material typically is by means of reactive sputtering, though any other suitable means of deposition may also be used. The location, width, and separation of the p-type NiO areas 120b were defined by the patterning of the photoresist as described above with respect to FIG. 1B and the corresponding width of trenches 106 and mesas 107 described above. In an exemplary embodiment, the width of the NiO areas 120b within the $Ga_2O_3$ is about 2.2 μm and a distance between them being about 1.7 μm.

In a next step, illustrated by the block schematic in FIG. 1J, a layer 120a of p-type NiO is deposited on the upper surface of the $SiO_2$ layer 102. In addition, NiO is also deposited in the trenches 109 formed in $Ga_2O_3$ layer 101, with the thickness of the NiO, both on the $SiO_2$ layer and in the trenches 109, being sufficient to form areas of p-type NiO 120b within the n-type $GaO_2$ layer 101. For example, in the case described above where the trenches have a depth of 400 nm, the NiO layer deposited both on the $SiO_2$ layer and in the trenches will have a thickness of at least 400 nm. Deposition of the NiO material typically is by means of reactive sputtering, though any other suitable means of deposition may also be used. The location, width, and separation of the p-type NiO areas 120b were defined by the patterning of the photoresist as described above with respect to FIG. 1B and the corresponding width of trenches 106 and mesas 107 described above. In an exemplary embodiment, the width of the NiO areas 120b within the $Ga_2O_3$ is about 2.2 μm and a distance between them being about 1.7 μm.

Figure 1K:
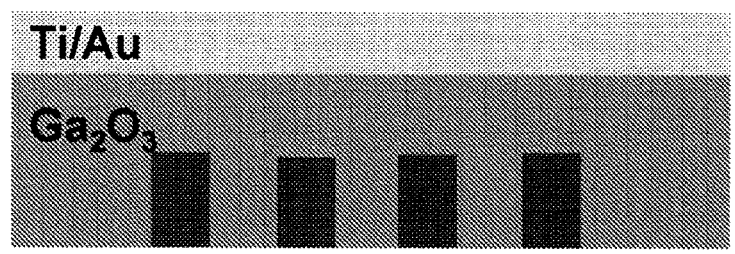
Figure 1K:
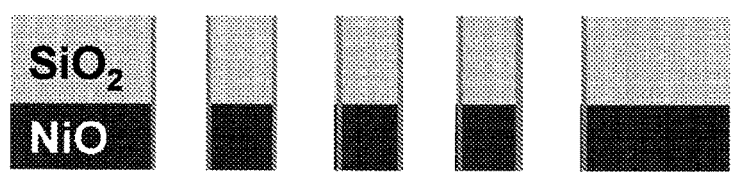
Figure 1L:
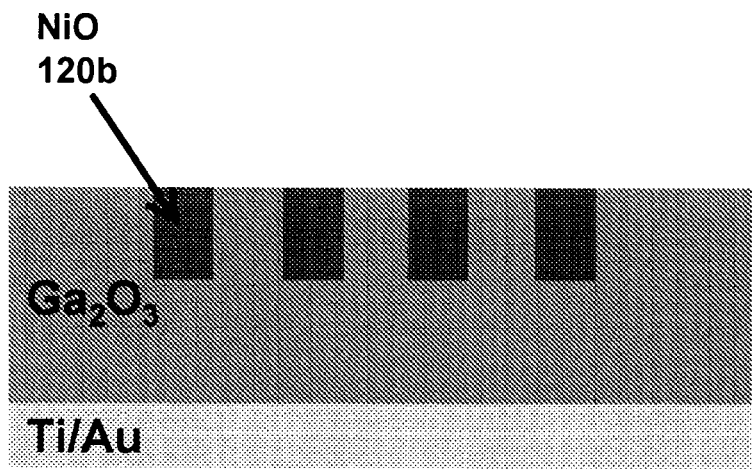

Next, as illustrated in FIG. 1K, a-Si/poly-Si layer 102 is further etched, e.g., using a $XeF_2$ etch or reactive ion etching in $SF_6$, to remove the remaining a-Si/poly-Si material in the mesas not previously etched in the trench formation steps described above. The removal of the a-Si/poly-Si material causes the remaining $SiO_2$ 103 material with deposited NiO 120a on an upper surface thereof to fall onto the $Ga_2O_3$ substrate 101 with the NiO areas 120b. Alternatively, the $XeF_2$ etch illustrated in FIG. 1K can be performed while physically inverting the $Ga_2O_3$ substrate in order to prevent the remaining $SiO_2$ 103 and deposited NiO 120a from being redeposited onto $Ga_2O_3$ 101. As illustrated in FIG. 1L, the remaining $SiO_2$ with deposited NiO is then removed from the structure and the structure is rinsed with deionized water to remove any remaining photoresist or other mask material that may have redeposited or fallen onto the $Ga_2O_3$ surface 101 during the $XeF_2$ etch.

Figure 1M:
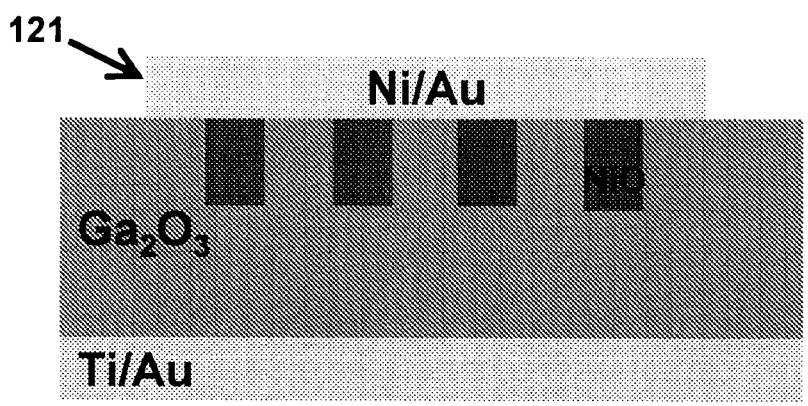

Finally, as illustrated in FIG. 1M, an anode such as Ni/Au anode 121 is deposited on the upper surface of the $Ga_2O_3$ layer 101 with the NiO-filled trenches 120b, where the Ni/Au metal stack comprising anode 121 satisfies both types of electrical contacts, i.e., it serves as a Schottky contact to the n-type material in $Ga_2O_3$ layer 101 and as an Ohmic contact to the p-type material in the NiO-filled trenches 120b. The formation of both types of electrical contacts is the final step in fabricating a self-aligned β-$Ga_2O_3$ JBS diode.

Figure 2A:
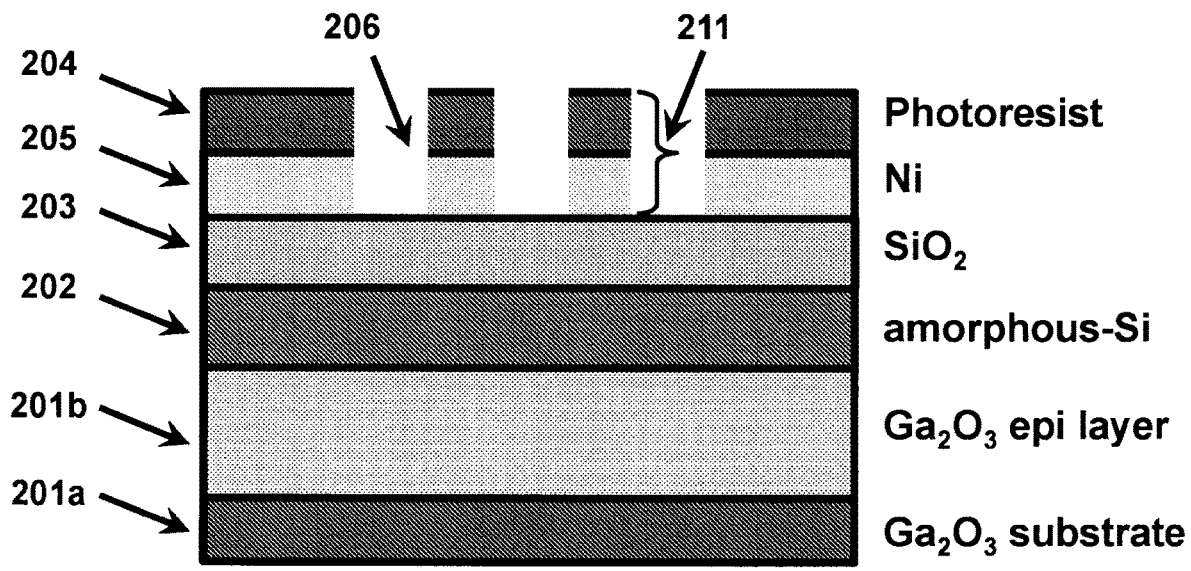
FIGS. 2A and 2B illustrate exemplary aspects of a self-aligned lithography process for the fabrication of a gallium oxide junction barrier Schottky diode in accordance with the present invention.
Figure 2B:
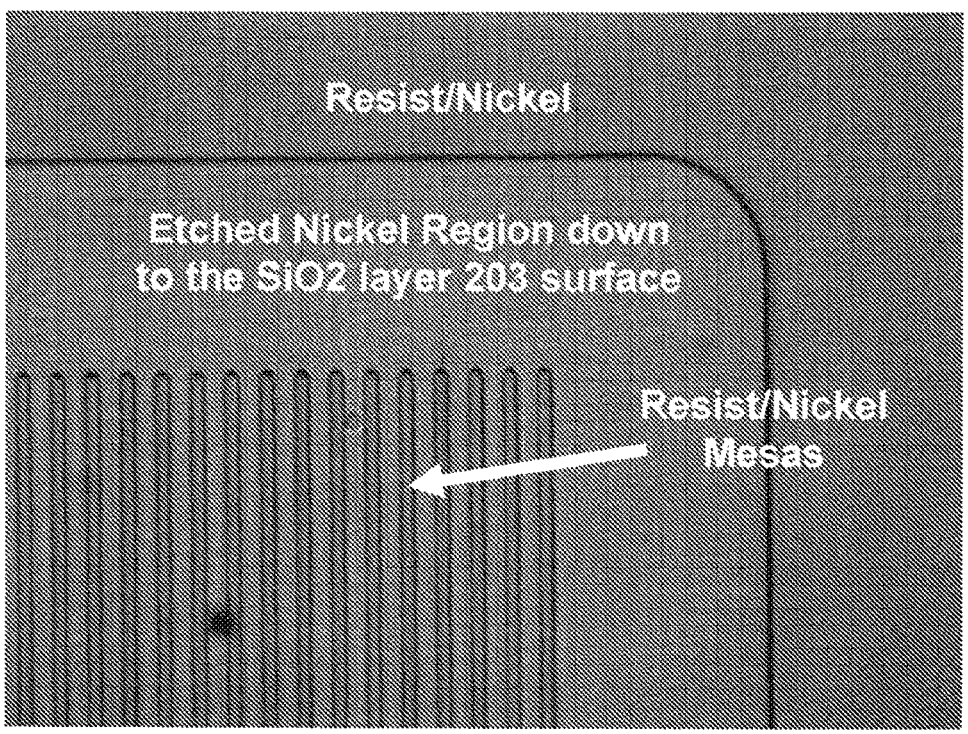

FIGS. 2A and 2B further illustrate aspects of the etching processes used in forming a self-aligned β-$Ga_2O_3$ JBS diode in accordance with the present invention in which features having a size of 1 μm are wet-etched into a nickel hard mask.

The block schematic in FIG. 2A illustrates an alternative embodiment of a masking structure that can be used in the self-aligned lithography process in accordance with the present invention. In the embodiment illustrated in FIG. 2A, a Ni layer 205 deposited on an upper surface of $SiO_2$ layer 203, between the $SiO_2$ layer and the photoresist 204 in a stack structure which also includes a $Ga_2O_3$ substrate 201a, a $Ga_2O_3$ epitaxial layer 201b on an upper surface of the $Ga_2O_3$ substrate, and an amorphous silicon (a-Si) layer 202 on an upper surface of the $Ga_2O_3$ epitaxial layer. Ni layer 205 serves as a hard mask to protect the a-Si layer 202 and the $SiO_2$ layer 203 from the damage that can occur in the absence of the Ni hard mask, e.g., the damage that can occur from a 800 W $BCl_3$ plasma etch at long durations (e.g., longer than 4 minutes), and thus provides more flexibility and greater etch selectivity than may be possible without the presence of the Ni layer.

The formation of the trenches and deposition of the additional material into the trenches is done in a manner as described above with respect to FIGS. 1A-1M. Thus, the location, width, and separation of the areas where the second type of material is to be deposited into the first type of material (e.g., where the NiO is to be deposited into the $Ga_2O_3$) is patterned and developed into the photoresist layer 204, e.g., using a Microposit MF-CD-26 developer. Nickel layer 210 is then etched in accordance with this patterning, using any suitable etching technique, typically wet etching, to form initial resist/nickel mesas 211 and etched regions 206 extending to the top surface of $SiO_2$ layer 203 such as those shown in the microscopic image in FIG. 2B. The formation of the trenches in $SiO_2$ layer 203, a-Si layer 202, and $Ga_2O_3$ layer 201b and the mesas separating the trenches proceeds as described above. However, the addition of the Ni hard mask allows for improved process flexibility and greater etch selectivity between the $Ga_2O_3$ layer 201b and the Ni hard mask layer 210. The improved etch selectivity allows for deep trenches (>1 μm) to be etched into $Ga_2O_3$ layer 201b if desired, without compromising the a-Si layer 202 and $SiO_2$ layer 203. The trenches are cleaned as described above and the Ni hard mask layer 210 is removed as a result of the aggressive hot phosphoric acid cleaning leaving behind a-Si layer 202 and $SiO_2$ layer 203. The short $XeF_2$ etch as described above is performed to undercut the $SiO_2$ layer 203. NiO is then deposited into the cleaned trenches to form predefined areas of p-type material in the n-type $Ga_2O_3$ in a manner described above.

Figure 3A:
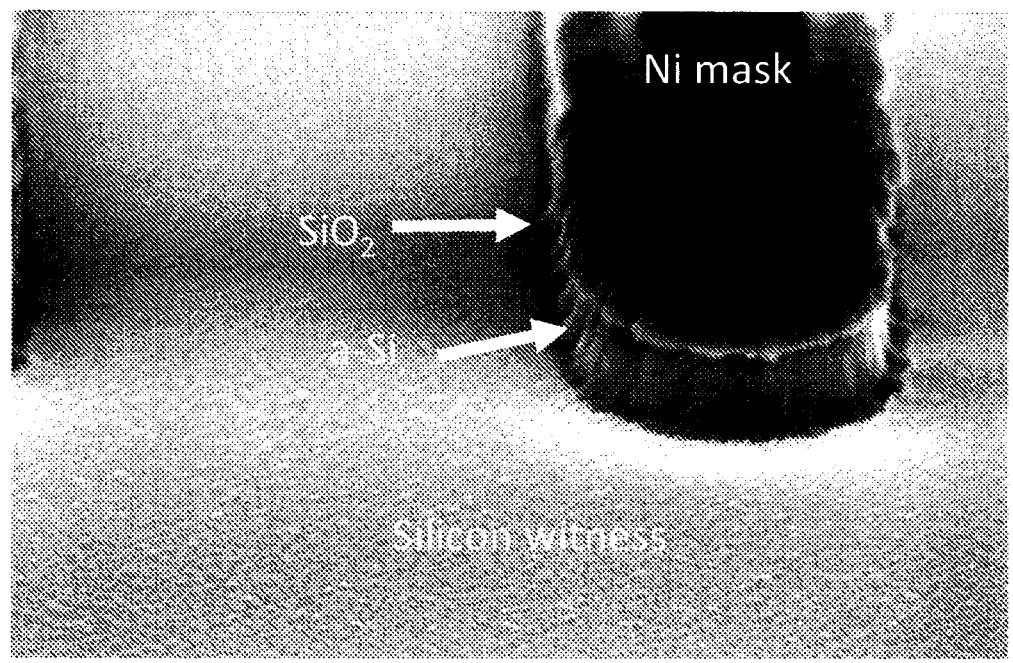
FIGS. 3A and 3B are microscopic images illustrating additional aspects of a self-aligned lithography process for the fabrication of a gallium oxide junction barrier Schottky diode in accordance with the present invention.
Figure 3B:
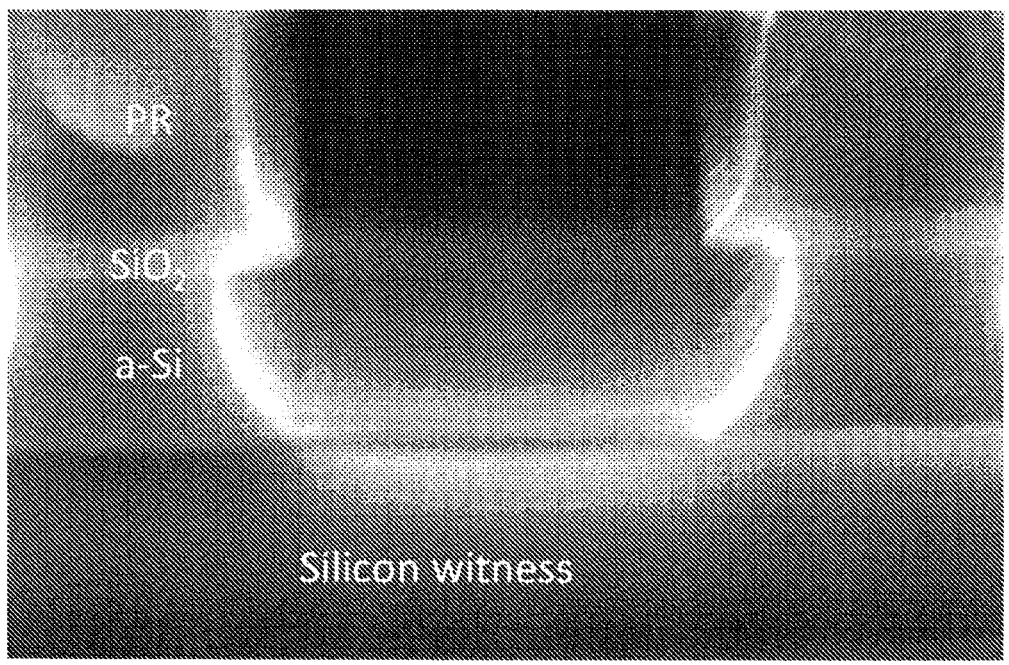

The scanning electron microscopic (SEM) images shown in FIGS. 3A and 3B provide additional illustration of the undercut formed in the silicon layer (a-Si in FIGS. 3A and 3B) and the $SiO_2$ layer.

The SEM image in FIG. 3A shows an undercut into the a-Si layer produced by the $XeF_2$ etching step described above, though with the a-Si layer on a p-type silicon substrate (silicon witness) instead of $Ga_2O_3$. Thus, in the example shown in FIG. 3A, 500 nm of a-Si was deposited atop the silicon witness followed by 100 nm of $SiO_2$ and a photoresist was deposited onto the $SiO_2$ and then patterned by standard photolithographic techniques. After the photoresist was developed and the trench features were etched into the $SiO_2$ and a-Si layer, a short burst, typically about 3 seconds in duration, of $XeF_2$ yielded the undercut of the a-Si layer shown in FIG. 3A.

The SEM image in FIG. 3B shows an alternative embodiment where a nickel layer is added atop the $SiO_2$. In this embodiment, as with the case described above with respect to FIG. 3A, a short, typically 3-second, burst of $XeF_2$ can be applied to yield a similar undercut of the a-Si layer underneath the $SiO_2$ layer.

Figure 4A:
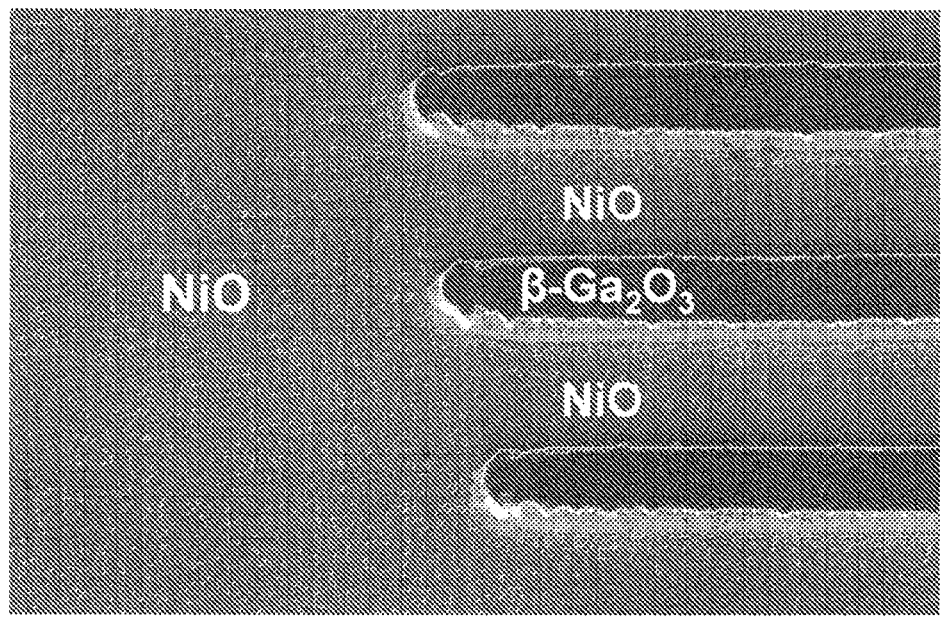
FIGS. 4A and 4B are microscopic images illustrating additional aspects of a self-aligned lithography process for the fabrication of a gallium oxide junction barrier Schottky diode in accordance with the present invention.
Figure 4B:
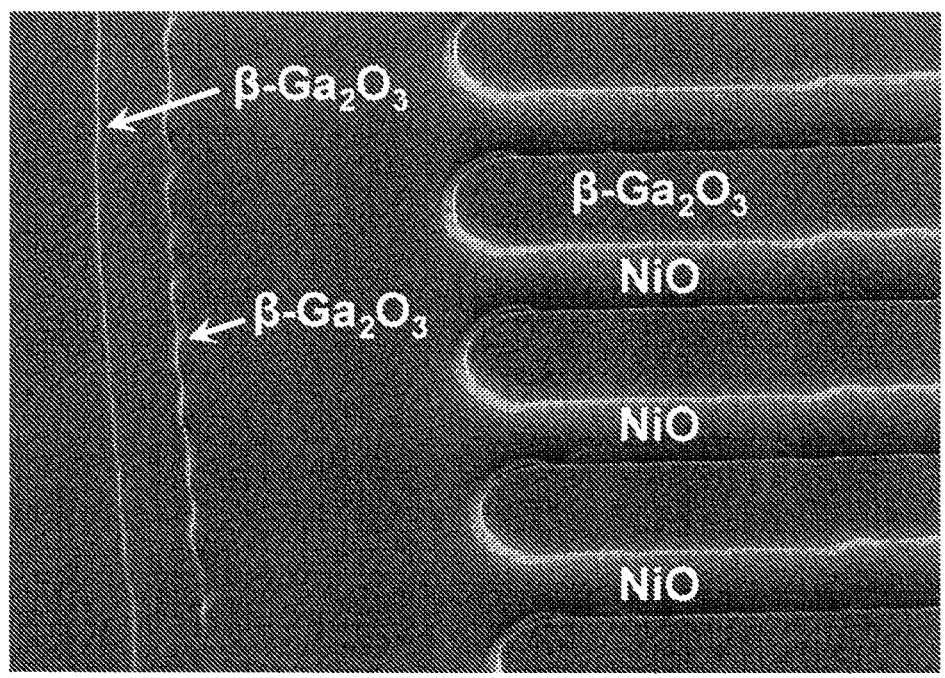

The images in FIGS. 4A and 4B further illustrate the effects of $BCl_3$ plasma etching of $Ga_2O_3$, the resultant material damage, and the importance of the post plasma etch damage removal.

FIG. 4A illustrates the physical damage left behind immediately following the $BCl_3$ 800 W plasma etch. The sidewalls of the etched $Ga_2O_3$ show significant damage as noted by the rough features.

FIG. 4B highlights how an acid etch of hot (80° C.) phosphoric acid can remove the majority of the physical damage to the $Ga_2O_3$, leaving behind smoother sidewalls and a more pristine $Ga_2O_3$ surface. The mask layers atop the $Ga_2O_3$ must be able to withstand the desired chemical treatment used to remove etch damage, e.g., a suitable layer of $SiO_2$ is able to withstand a phosphoric acid, hydrochloric acid, piranha etchant ($H_2SO_4:H_2O_2$), dilute aqua regia (HCl: $HNO_3:H_2O$), as well as various proprietary metal wet etchants known to those skilled in the art. See, e.g., K. R. Williams, et al., "Etch Rates for Micromachining Processing—Part II," *J. Microelectromechanical Systems*, vol. 12, no. 6, pp. 761, 2003.

Figure 5A:
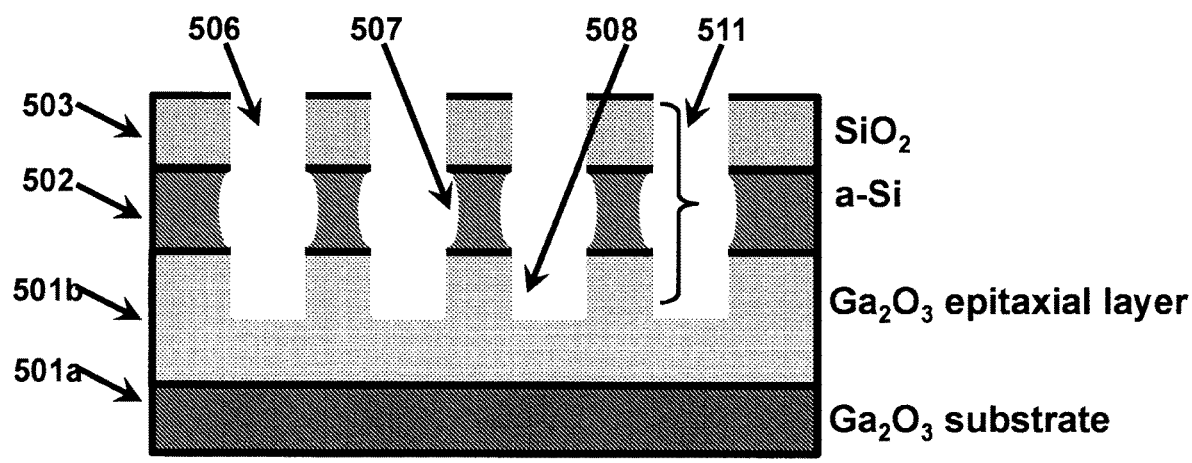
FIGS. 5A and 5B are block schematics illustrating additional aspects of a self-aligned lithography process for the fabrication of a gallium oxide junction barrier Schottky diode in accordance with the present intervention.

The block schematic in FIG. 5A illustrates an exemplary embodiment of a self-aligned JBS diode mask such as that illustrated in FIG. 2A, with a $Ga_2O_3$ substrate 501a, $Ga_2O_3$ epitaxial layer 501b, a-Si layer 503, and $SiO_2$ layer 504 after the resist and nickel layers are removed, e.g., by the phosphoric treatment and the remaining etched structure, e.g., by a $BCl_3$ plasma etch to form initial trenches 506. After this initial plasma etch, undercut areas 507 in a-Si layer 503 are formed, e.g., by a short "burst" of XeF gas applied to the a-Si material (1-5 seconds), and the structure is then further etched so that the initially formed trenches 506 in the $SiO_2$ and a-Si material extend into the epitaxial $Ga_2O_3$ material as trenches 508, with $SiO_2$/a-Si mesas 211 remaining between the trenches.

Figure 5B:
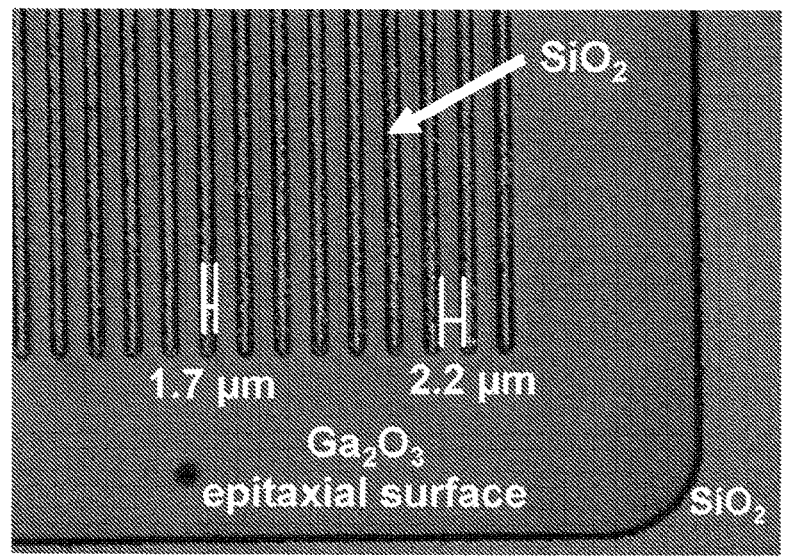

The image in FIG. 5B shows an example of a structure such as that illustrated schematically in FIG. 5A. In the structure shown in FIG. 5B, the nickel layer of the mask was removed during a phosphoric treatment such as that described above. The $SiO_2$ layer is now the top layer of the mask for the remainder of the process. In the illustrated example, the $SiO_2$ mesas are ~1.7 μm wide, while the etched regions between the mesas are ~2.2 μm wide. The small feature sizes highlight the capabilities of this self-aligned process to achieve ~1 μm feature sizes while still offering robustness to elevated temperatures and most commonly used chemical treatments for $Ga_2O_3$ etch damage removal. Control over the feature sizes is also a critical aspect for the electric field profile a JBS a diode.

Figure 6A:
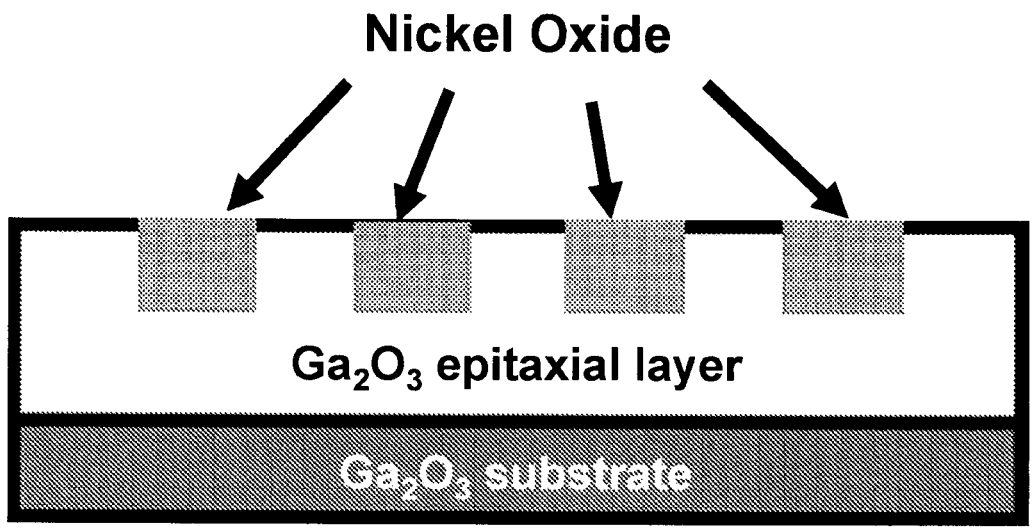
FIGS. 6A and 6B further illustrate aspects of a self-aligned lithography process for the fabrication of a gallium oxide junction barrier Schottky diode in accordance with the present intervention.

The block schematic in FIG. 6A depicts a JBS diode following successful liftoff of the mask and excess nickel oxide using $XeF_2$. This step highlighted in FIG. 6A concludes the self-aligned process. The remaining features for the culmination of a JBS diode (termination regions and metal contacts) are fabricated using traditional lithography processing.

Figure 6B:
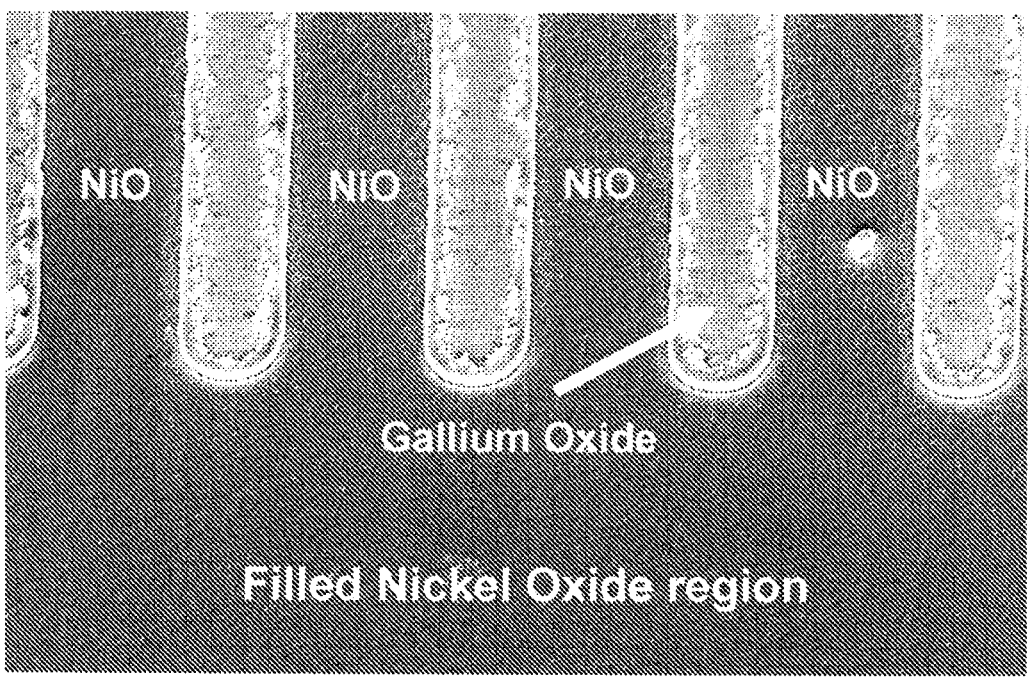

The image in FIG. 6B shows a SEM image after the deposition of the NiO into the etch $Ga_2O_3$ trenches and the removal of the self-aligned mask using $XeF_2$. FIG. 6B is the reduction to practice for the block schematic described above with respect to FIG. 6A. The flakes seen FIG. 6B can be washed away with a short solvent clean (acetone/IPA) to conclude the self-aligned process.

Advantages and New Features

The present invention provides numerous new features stemming from advances in device fabrication that fill voids in the current gallium oxide device technology.

Prior to the present invention, a self-aligned method for etching, filling, and lifting off of features as small as 1 μm on gallium oxide devices had not been realized. Any competing method that does not utilize a self-aligned process suffers from misalignments and uneven deposition of nickel oxide into etched regions. Current methods that employ a form of self-alignment are not capable of 1) lifting off deposited material outside of the etched regions, 2) surviving aggressive chemical treatments, or 3) withstanding temperatures above those used for the baking of resist. The invention detailed here allows for all aforementioned shortcomings currently seen in the literature as well as utilizes a $XeF_2$ dry liftoff process. The dry liftoff process further differentiates this invention from the standard wet liftoff process. By combining all of these advantages into one process, it is possible to accurately control the ratio of Ohmic/Schottky area within the junction barrier Schottky diode.

Although particular embodiments, aspects, and features have been described and illustrated, one skilled in the art would readily appreciate that the invention described herein is not limited to only those embodiments, aspects, and features but also contemplates any and all modifications and alternative embodiments that are within the spirit and scope of the underlying invention described and claimed herein. The present application contemplates any and all modifications within the spirit and scope of the underlying invention described and claimed herein, and all such modifications and alternative embodiments are deemed to be within the scope and spirit of the present disclosure.

What is claimed is:

1. A method for fabricating an electronic device, comprising:

forming a semiconductor material stack including a layer of amorphous or polycrystalline silicon (a-Si/poly-Si) deposited on an upper surface of a first semiconductor material layer, the first semiconductor material having a first type of conductivity;

depositing a layer of $SiO_2$ on an upper surface of the a-Si/poly-Si layer;

depositing a photoresist layer on an upper surface of the $SiO_2$ layer;

patterning the photoresist layer to define a predetermined plurality of areas for deposition of a second semiconductor material having a second type of conductivity into the first semiconductor materials, the second type of conductivity being different from the first type of conductivity;

etching the SiO$_2$ along the areas defined in the photoresist to form trenches in the SiO$_2$ layer separated by SiO$_2$ mesas;

removing the photoresist and further etching the trenches in the SiO$_2$ layer so as to extend the trenches into the a-Si/poly Si layer;

etching each trench within the a-Si/poly-Si layer to form an undercut beneath the SiO$_2$ material in each trench;

further etching the trenches with the formed undercut areas into the first semiconductor material layer to form trenches in the first semiconductor material;

cleaning the trenches and the undercut areas to remove physical and chemical damage caused during etching;

forming a contact layer on a backside of the first semiconductor material layer;

depositing a layer of the second semiconductor material into the trenches in the first semiconductor material layer, a thickness of the second semiconductor material in the first semiconductor material being sufficient to fill the trenches and form filled trenches of the second semiconductor material, the filled trenches having the second type of conductivity within the first semiconductor material a location, width, and separation of the filled trenches being defined by the patterning of the photoresist;

further etching the a-Si/poly-Si layer to remove any remaining a-Si/poly-Si material not removed when the trenches were etched;

removing the remaining SiO$_2$ with the deposited SiO$_2$ so that only the first semiconductor material layer with the filled trenches of the deposited second semiconductor material remain; and depositing a metal anode comprising a metal stack on an upper surface of the first semiconductor material layer with the filled trenches of the second semiconductor material, where the first semiconductor material serves as first type of contact to the metal anode and the second semiconductor material serves as a second type of contact to the metal anode.

2. The method according to claim 1, wherein the first semiconductor material has an n-type conductivity and the second semiconductor material has a p-type conductivity.

3. The method according to claim 2, wherein the first semiconductor material comprises Gallium Oxide, Germanium Oxide, Aluminum Oxide, Zinc Oxide, Indium Oxide, Tin Oxide, Cadmium Oxide, Scandium Oxide, Aluminum Nitride, Boron Nitride, Diamond, Aluminum Gallium Oxide (AGO), Lithium Gallium Oxide (LGO), Aluminum Zinc Oxide (AZO), Gallium Zinc Oxide (GZO), Indium Zinc Oxide (IZO), Indium Tin Oxide (ITO), Indium Tin Zirconium Oxide (ITZO), Indium Gallium Oxide (IGO), Indium Gallium Zinc Oxide (IGZO), Zinc Tin Oxide (ZTO), perovskite oxides, niobates, stannates, or vanadium oxides.

4. The method according to claim 2, wherein the second semiconductor material comprises Silicon, Gallium Arsenide, Gallium Nitride, Aluminum Gallium Nitride, Aluminum Nitride, Boron Nitride, binary or ternary Copper oxides, spinel oxides, perovskites, Nickel Oxide, Cuprous Iodide, or Diamond.

5. The method according to claim 1, wherein the first semiconductor material has a p-type conductivity and the second semiconductor material has an n-type conductivity.

6. The method according to claim 5, wherein the first semiconductor material comprises Silicon, Gallium Arsenide, Gallium Nitride, Aluminum Gallium Nitride, Aluminum Nitride, Boron Nitride, binary or ternary Copper oxide, spinel oxide, perovskites, Nickel Oxide, Cuprous Iodide, or Diamond.

7. The method according to claim 5, wherein the second semiconductor material comprises Gallium Oxide, Germanium Oxide, Aluminum Oxide, Zinc Oxide, Indium Oxide, Tin Oxide, Cadmium Oxide, Scandium Oxide, Aluminum Nitride, Boron Nitride, Diamond, or ternary and quaternary compounds of the aforementioned oxides such as Aluminum Gallium Oxide (AGO), Lithium Gallium Oxide (LGO), Aluminum Zinc Oxide (AZO), Gallium Zinc Oxide (GZO), Indium Zinc Oxide (IZO), Indium Tin Oxide (ITO), Indium Tin Zirconium Oxide (ITZO), Indium Gallium Oxide (IGO), Indium Gallium Zinc Oxide (IGZO), Zinc Tin Oxide (ZTO), perovskite oxides, niobates, stannates, or vanadium oxides.

8. The method according to claim 1, wherein the first semiconductor material is n-type Ga$_2$O$_3$ and the second semiconductor material is p-type NiO; and wherein the metal anode creates a Schottky contact to the n-type Ga$_2$O$_3$ material and as an Ohmic contact to the p-type NiO in the NiO-filled trenches.

9. The method according to claim 1, wherein the filled trenches within the first semiconductor material layer have a width of about 2.2 μm and are spaced about 1.7 μm apart.

10. The method according to claim 1, further comprising depositing a Ni layer between the SiO$_2$ layer and the photoresist, the Ni layer forming a hard mask for the etching of the trenches for deposition of the second semiconductor material into the first semiconductor material.

* * * * *